United States Patent [19]

Song et al.

[11] Patent Number: 5,534,720

[45] Date of Patent: Jul. 9, 1996

[54] SOLID STATE IMAGE SENSING ELEMENT

[75] Inventors: Kwang B. Song; Sung K. Kim, both of Seoul; Jin S. Shim, Kyungki-do, all of Rep. of Korea

[73] Assignee: LG Semicon Co., Ltd., Seoul, Rep. of Korea

[21] Appl. No.: 525,951

[22] Filed: Sep. 7, 1995

Related U.S. Application Data

[63] Continuation of Ser. No. 210,225, Mar. 17, 1994, abandoned.

[30] Foreign Application Priority Data

Feb. 23, 1994 [KR] Rep. of Korea .................. 3197/1994

[51] Int. Cl.$^6$ .................. H01L 27/148; H01L 29/768
[52] U.S. Cl. .................. 257/232; 257/233; 257/432; 257/440; 257/446
[58] Field of Search .................. 257/225, 232, 257/233, 452, 440, 443, 466

[56] References Cited

U.S. PATENT DOCUMENTS 4,694,185  9/1987  Weiss .................. 257/432
5,118,924  6/1992  Mehra et al. .................. 257/432
5,321,297  6/1994  Enomoto .................. 257/432

FOREIGN PATENT DOCUMENTS

| 0507456 | 10/1992 | European Pat. Off. | 257/432 |
| 2-309674 | 12/1990 | Japan | 257/432 |
| 3-190167 | 8/1991 | Japan | 257/432 |
| 4-225278 | 8/1992 | Japan | 257/432 |
| 4-278582 | 10/1992 | Japan | 257/432 |
| 2251721 | 7/1992 | United Kingdom | 257/432 |

*Primary Examiner*—Ngân V. Ngô
*Attorney, Agent, or Firm*—Morgan, Lewis and Bockius

[57] ABSTRACT

A solid state image sensing element including a substrate, photodiode areas each having a plurality of photodiodes in matrix array formed on the substrate, a flat area formed over the substrate including the photodiode areas, color filter layers formed in predetermined areas on the flat area, a top coating layer formed in predetermined areas on the flat area, a top coating layer formed over the substrate including the color filter areas, stripe microlenses each having a flat upper surface arranged to correspond to the photodiodes arranged in one direction in the photodiode areas and formed on the top coating layer, and mosaic microlenses formed on the flat upper surface of the stripe microlens each arranged corresponding to each of the photodiodes in the photodiode area.

8 Claims, 7 Drawing Sheets

SOLID STATE IMAGE SENSING ELEMENT

This is a continuation of application Ser. No. 08/210,225 filed on Mar. 17, 1994, now abandoned.

FIELD OF THE INVENTION

This invention relates to solid state image sensing elements and to methods for fabricating solid state image sensing elements. It more particularly relates to microlenses of solid state image sensing elements and methods for fabricating these microlenses.

BACKGROUND OF THE INVENTION

Figure 1:
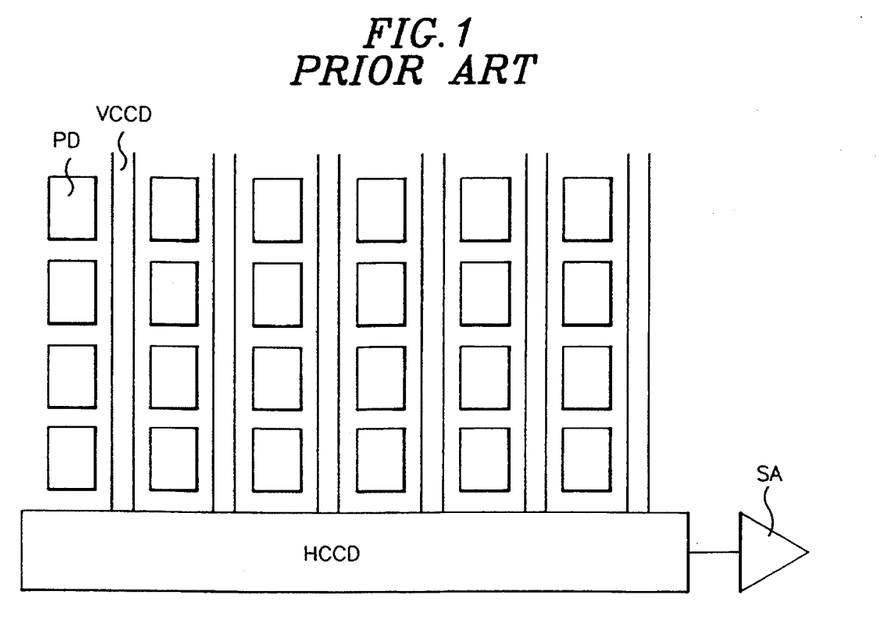
FIG. 1 is a plan view of a conventional solid state image sensing element.

Generally, a solid state image sensing dement has a construction shown in FIG. 1 wherein photodiodes converting received light signals into electronic signals are arranged in matrix form having certain distances in the vertical and horizontal directions, vertical charge coupled device (VCCD) areas for transmitting charges generated in the photodiodes in the vertical direction are formed between the photodiodes, a horizontal charge coupled device (HCCD) area for transmitting charges transmitted from the VCCD areas in horizontal directions is formed at the output ends of the VCCD areas, and a sensing amplifier (SA) for detecting the amount of charge in the HCCD area is formed at the output end of the HCCD area. The operation of the solid state image sensing element is as follows.

The charge generated in the photodiodes by incident light is transmitted to the VCCD area at the moment when a gate bias (15 V) is loaded. The charge transmitted to the VCCD area is transmitted to the HCCD area by a −9 V to 0 V VCCD clocking signal, and the charge transmitted to the HCCD area is transmitted to the output side by a 0 V to 5 V clocking signal, which charge is converted into a voltage signal at the output side to output through the sensing amplifier.

Figure 2:
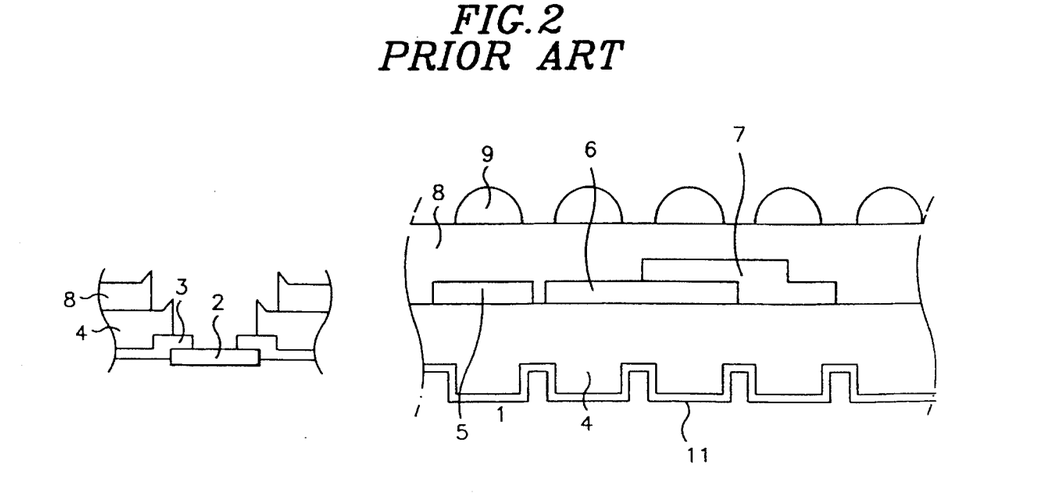
FIG. 2 is a partial section of a conventional solid state image sensing element.

Shown in FIG. 2 is a section of a conventional solid state image sensing element which is fabricated by forming a metal film 11 for light interception on charge transmission and poly gate areas on a substrate photodiode areas 1 and charge transmission and poly gate areas having been formed thereon, forming a metal film in pad portions, forming a metal film 2 for pad by patterning of the metal film in the pad portions, depositing an insulation film 3 such as a nitride film over the metal film 2, carrying out selective removal of the insulation film 3 of the pad portions, forming a flat layer 4 over the substrate, forming color filter layers 5, 6 and 7 on the flat area 4, forming a top coating layer 8 for flattening, forming microlenses 9 each positioned corresponding to each of the photodiodes below on the top coating layer 8, and opening the pad portions by selective removal of the top coating layer 8 and the flat area 4 of the pad portions.

Light incident through the microlens 9 irradiates the photodiodes through the top coating layer 8, the color filter layers 5, 6 and 7 and the flat layer 4. This light, after having been converted into an image signal in the photodiodes and transmitted through the VCCD areas and the HCCD area, is reproduced into an image signal by the sensing amplifier.

As described above, conventional solid state image sensing elements focus incident light by means of a lens array formed on the color filter layers for improving sensitivity. The lens array is formed by forming lens shapes by carrying out patterning of transparent photoresist having a refractive index of 1.6 and melting it.

In such lens arrays, it is preferable to make the distances between the lenses as close as possible because the light incident between lenses is not focused. These distances, in general, are designed to be the same in vertical and horizontal directions (in general, a dimension within the resolution limit of resist). At this time, when the dimensions of a unit pixel (photodiode) in the vertical directions and horizontal directions are different, an image under the lens projected becomes not a regular square but a rectangle (see FIGS. 3(a) and 3(b)). And because curvatures of the lens in the vertical and horizontal sections are different, the focal distances are also different.

Decreased sensitivity of a solid state image sensing element due to such effect cannot be neglected. Consequently, solid state image sensing elements provided with lenses each having a double layer have been proposed.

Figure 3A:
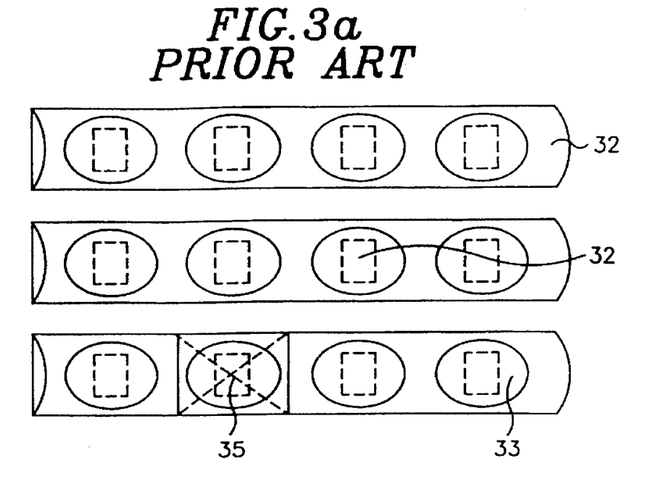
FIGS. 3(a), 3(b) and 3(c) show microlenses of a solid state image sensing element having conventional double layered microlenses.
Figure 3B:
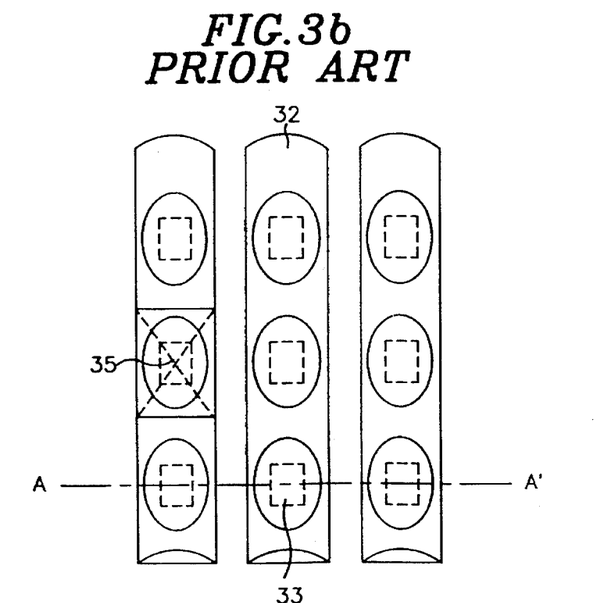
Figure 3C:
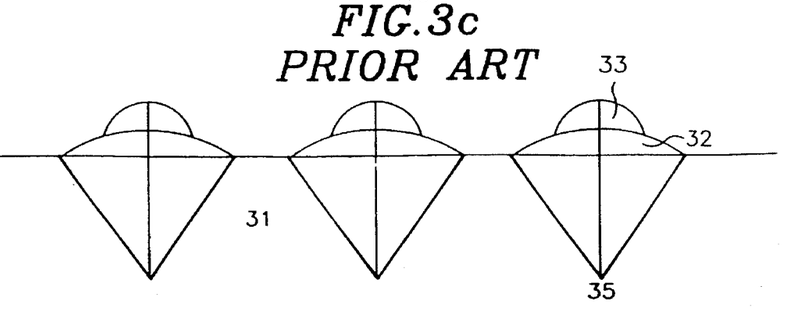

Referring to FIGS. 3(a) and 3(b), in case the dimension of a unit pixel, i.e., a photodiode 21, in the vertical direction is greater than the horizontal direction, FIG. 3(a) shows a plan view of a situation wherein a stripe microlens and a mosaic microlens are formed in the horizontal direction of the photodiodes. FIG. 3(b) shows a plan view of a situation wherein a stripe microlens and a mosaic microlens are formed in the vertical direction of the photodiodes. And FIG. 3(c) shows a section along line A–A' of FIG. 3(b), wherein the lens is made in a double layer by forming the stripe microlens 32 in horizontal or vertical directions over the photodiode area 21 and subsequent forming of the mosaic microlenses 33 on the stripe microlens 32. The reference numerals 35 in FIGS. 3(a), 3(b) and 3(c) represent focusing points.

Referring to FIGS. 4(a) to 4(f), a method for fabricating a solid state image sensing element adapting an array of lenses having the double layer will now be explained.

Figure 4A:
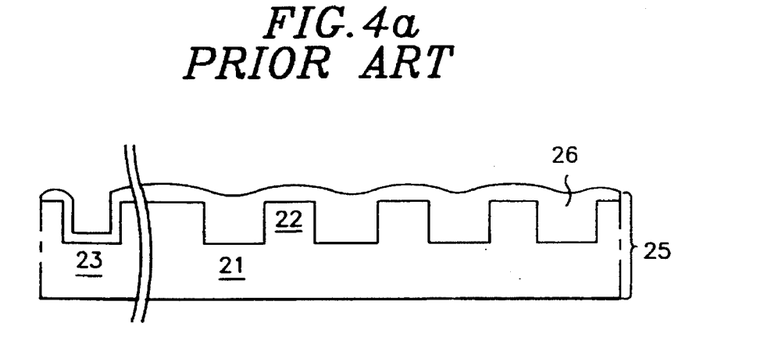
FIGS. 4(a), 4(b), 4(c), 4(d), 4(e) and 4(f) show a process for fabricating a solid state image sensing element having conventional double layered microlenses.

First, as shown in FIG. 4(a), a black and white solid state image sensing element 25 having photodiodes 21 and VCCDs 22 is formed, and a nitride film 26 as a passivation layer is formed thereon. The reference number 23 in FIG. 4(a) represents a pad portion.

Figure 4B:
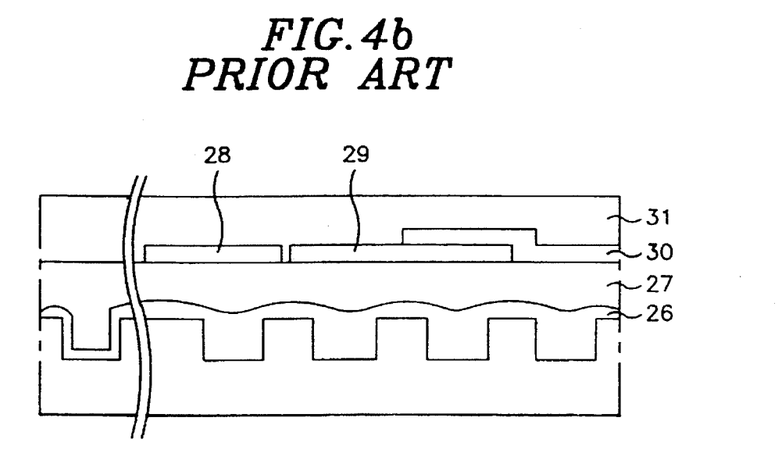

Then, as shown in FIG. 4(b), a flat layer 27 is formed on the nitride film 26, a first dyeing layer 28 is formed on the flat layer, the first dyeing layer is cured after having been dyed in a first color, followed by forming of a second dyeing layer 29 and subsequent dyeing in a second color and curing then, after a third dyeing layer 30 is formed. The third layer 30 is dyed in a third color and cured, completing the forming of color filter layers 28, 29 and 30. Then a top coating 31 is formed over the substrate.

Figure 4C:
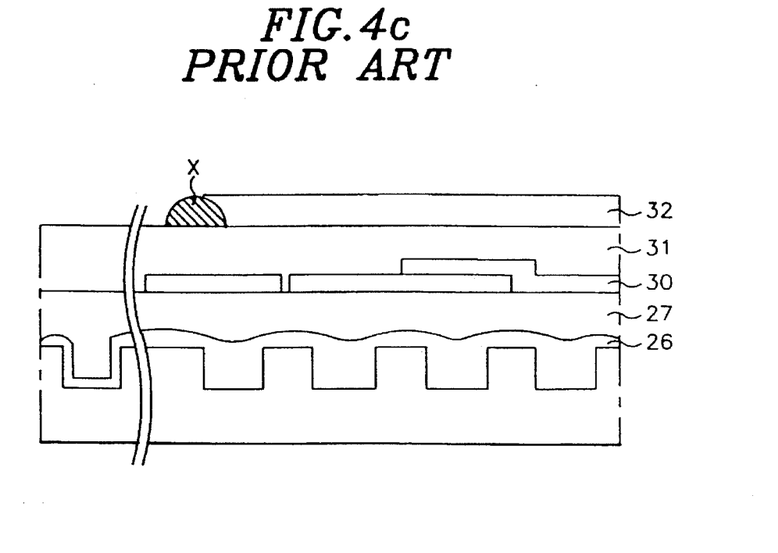

Next, as shown in FIG. 4(c), after photoresist for forming a stripe microlens layer is coated on the top coating layer 31, exposure, development and reflow are carried out to form a stripe microlens layer 32. In FIG. 4(c), the stripe microlens layer 32 is shown not in partial section but in perspective view to show the round shape of the lens section X.

Figure 4D:
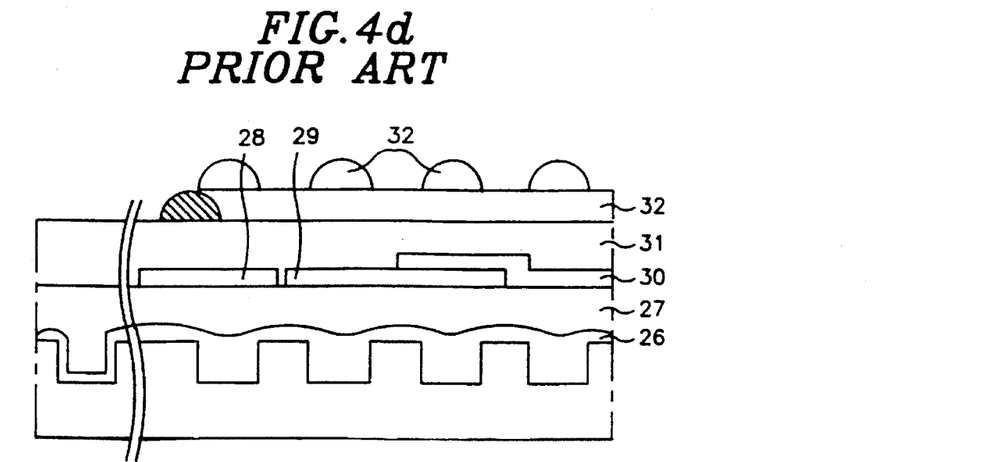

Then, as shown in FIG. 4(d), after the photoresist for forming a mosaic microlens layer on the stripe microlens 32 is coated, exposure, development and reflow are carried out to form oval mosaic microlens layers 33, each shaped as shown in FIGS. 3(a) and 3(b) and positioned corresponding to each of the photodiodes.

Figure 4E:
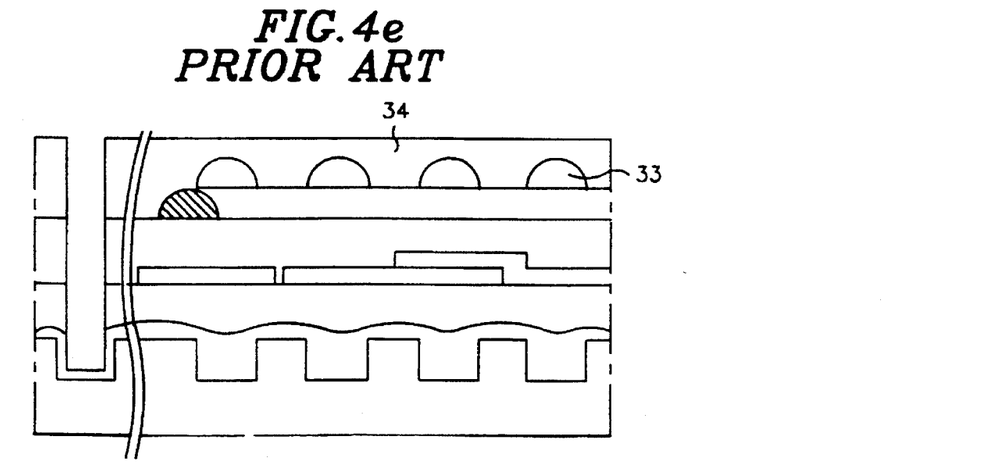

Next, as shown in FIG. 4(e), after photoresist 34 is coated over the substrate, a photoresist pattern 34 for opening the pad portions by selective exposure and development is formed, and the top coating layer 31 and the flat layer 27 are etched to expose the pad portions 23 using the photoresist pattern 34 as a mask.

Figure 4F:
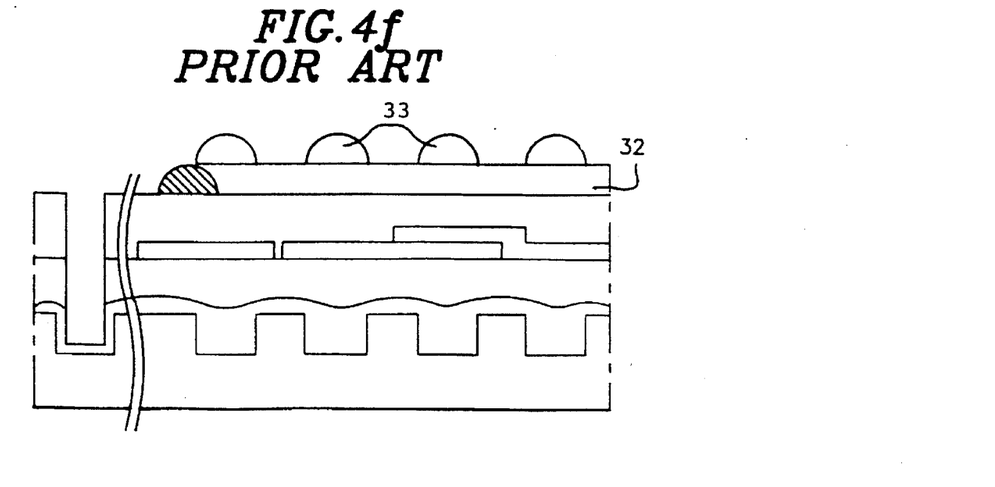

Then, the forming of a color image scanning element having double layered microlens layers as shown in FIG. 4(f) is completed by removing the photoresist 34.

However, in fabrication of conventional solid state image sensing elements having double layered microlenses, because the mosaic microlenses 33 are formed directly on top of the convex portion of the stripe microlens 32 having a shape of a convex lens as shown in FIG. 3(c), carrying out the patterning and reflow process on the convex surface is not easy.

Moreover, as the degree of integration increases the focusing point or distance should become shorter, which requires shorter curvature of the microlens. However, because, only with the reflow process of the photoresist for forming microlenses in the conventional art described above, decreases of the height together with decrease of the curvature of the stripe microlens cannot be achieved at the same time, application of this art to fabrication of solid state image sensing elements of next generation is not practicable.

SUMMARY OF THE INVENTION

The object of this invention is to provide microlenses of a solid state image sensing element and a method for fabricating these microlenses which are easy to fabricate and to decrease curvature meeting the trend of making slim solid state image sensing elements.

This and other objects and features of this invention can be achieved by providing a solid state image sensing element including a substrate, photodiode areas each having a plurality of photodiodes in matrix array formed on the substrate, a flat area formed over the substrate including the photodiode areas, color filter layers formed in predetermined areas on the flat area, a top coating layer formed over the substrate including the color filter areas, stripe microlenses each having a flat upper surface arranged corresponding to the photodiodes, arranged in one direction in the photodiode areas and formed on the top coating layer, and mosaic microlenses formed on the flat upper surface of the stripe microlens each arranged corresponding to each of the photodiodes in the photodiode area.

This and other objects and features of this invention can also be achieved by providing a method for fabricating solid state image sensing elements including processes for forming a passivation layer on a substrate, photodiodes, vertical solid state image sensing elements and horizontal solid state image sensing elements and metal pad portions having been formed thereon, forming a flat layer on the passivation layer, forming color filter layers on the flat layer, forming a top coating layer over the substrate including the color filter layers, coating a first photoresist on the top coating layer, forming a stripe microlens pattern on the photodiode areas by selective exposure and development of the first photoresist, reflowing of the first photoresist pattern with heat treatment, coating photoresist over the substrate on which the first photoresist pattern has been formed, forming a predetermined pattern by selective exposure and development of the photoresist, forming stripe microlenses by carrying out selective etching of the top coating layer and the flat layer to expose the metal pad portions together with etching of the upper part of the first photoresist pattern to a certain thickness using the photoresist pattern as a mask, removing the remaining photoresist pattern, coating a second photoresist pattern on the stripe microlens layers, forming a mosaic microlens pattern on the flat upper surfaces of the stripe microlens layers by selective exposure and development of the second photoresist, and forming mosaic microlens layers by reflowing of the second photoresist pattern.

DETAILED DESCRIPTION OF THE INVENTION

This invention is to be explained in detail hereinafter, referring to the attached drawings. Shown in FIGS. 5(a), 5(b) and 5(c) are microlenses of a solid state image sensing element in accordance with this invention.

Figure 5A:
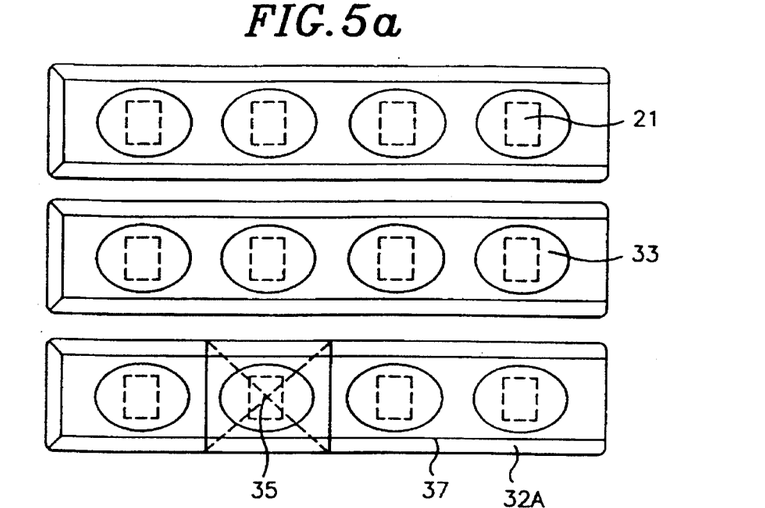
FIGS. 5(a), 5(b) and 5(c) show an arrangement of microlenses of a solid state image sensing element having double layered microlenses in accordance with this invention.

In cases when the vertical dimension of a unit pixel, i.e., a photodiode 21, is greater than the horizontal dimension, shown in FIG. 5(a) is a plan view of a case where stripe microlenses and mosaic microlenses are formed in a horizontal direction over the area of the photodiodes 21. Shown in FIG. 5(b) is a plan view of a case where the stripe microlenses and mosaic microlenses are formed in a vertical direction. And shown in FIG. 5(c) is a section on line A—A' of FIG. 5(b).

A microlens of a solid state image sensing element in accordance with this invention includes a double layer having a flat top 37, stripe microlens 32A formed in horizontal or vertical direction over a photodiode area and a mosaic microlens 33 formed on the stripe microlens 32A positioned corresponding to each photodiode. The reference numbers 35 in FIGS. 5(a), 5(b) and 5(c) represent focusing points.

Figure 5B:
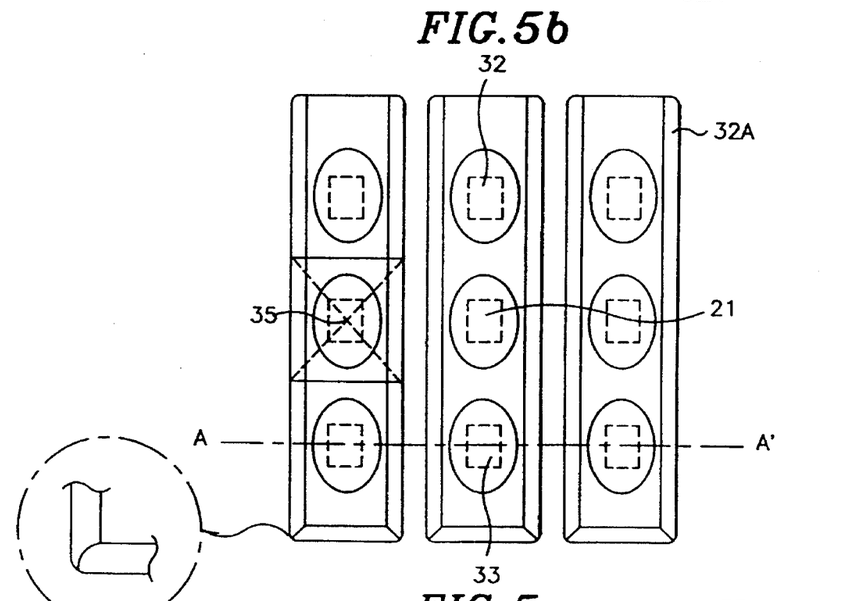
Figure 5C:
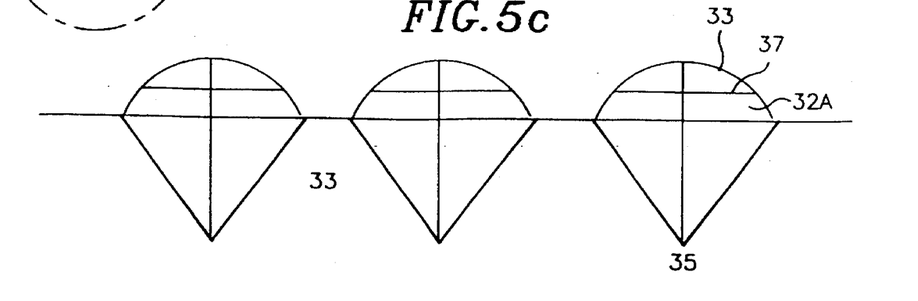

As shown in FIGS. 5(a), 5(b) and 5(c), a microlens of the solid state image sensing element in accordance with this invention includes a stripe microlens 32A having a flat top 37 defining a lower microlens and an oval or semi-spherical mosaic microlens 33 formed on the flat top 37 of the stripe microlens without covering the side surface and defining an upper lens.

Because the mosaic microlens is formed on the flat top surface of the stripe microlens, the fabrication is easier than the conventional case in which the mosaic microlens is formed on a convex lens shape stripe microlens. A method for fabricating solid state image sensing element is explained hereinafter, referring to FIGS. 6(a), 6(b), 6(c), 6(d) and 6(e).

Figure 6A:
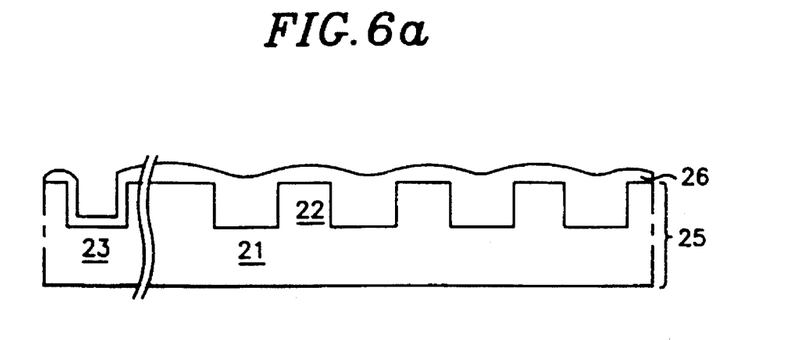
FIGS. 6(a), 6(b), 6(c), 6(d) and 6(e) show a process for fabricating a solid state image sensing element having double layered microlenses in accordance with this invention.

First, as shown in FIG. 6(a), after a black and white solid state image sensing element 25 having photodiodes 21 and VCCDs 22 is formed, a nitride film 26 as a passivation layer is formed thereon. Reference number 23 in FIG. 6(a) represents a pad portion.

Figure 6B:
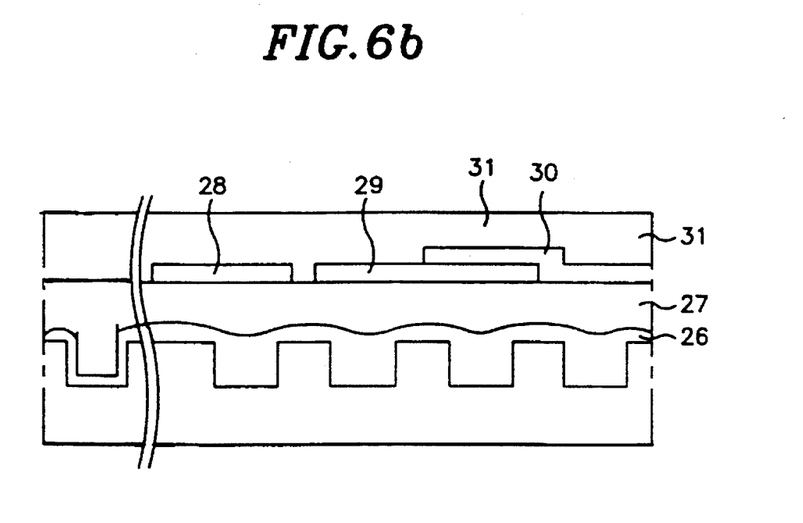

Then, as shown in FIG. 6(b), a flat layer 27 is formed on the nitride film 26, and a first dyeing layer 28 is formed on the flat layer 27, which dyeing layer is dyed in a first color and cured thereafter. This is followed by forming of a second dyeing layer 29 and dyeing in a second color and curing, and subsequent forming of a third dyeing layer 30 and dyeing in a third color and curing to thereby form color filter layers 28, 29 and 30. A top coating layer 31 is then formed over the substrate.

Figure 6C:
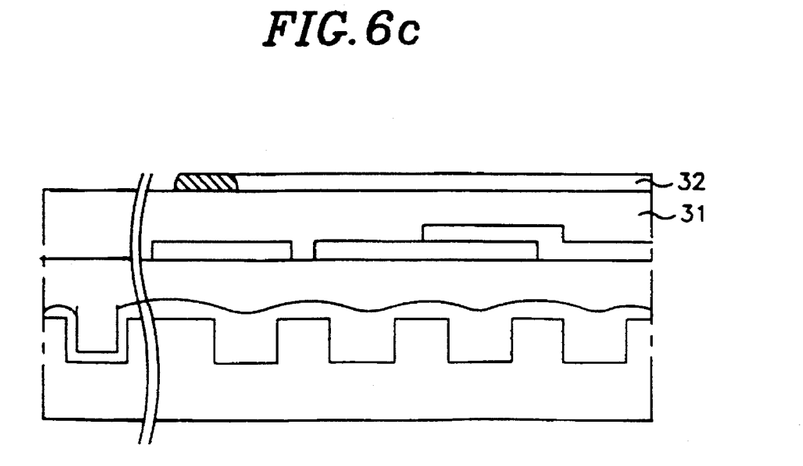
Figure 6D:
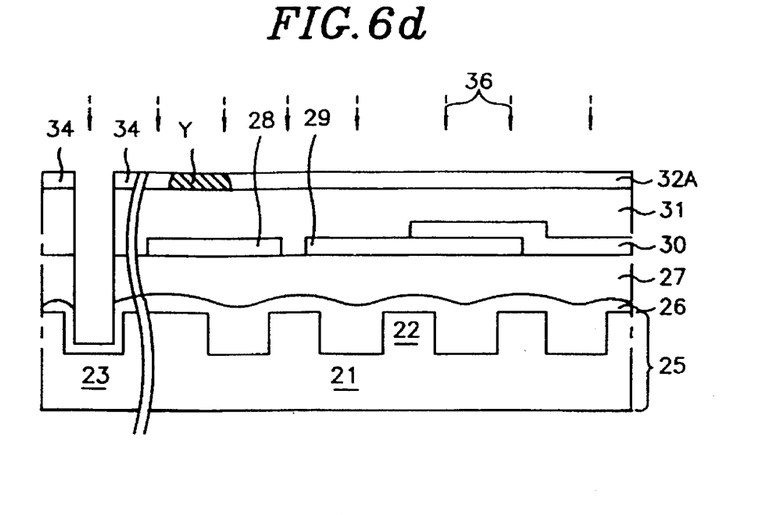

Next, as shown in FIG. 6(c), after photoresist for forming a stripe microlens layer is coated on the top coating layer 31, exposure, development and reflow are carried out to form a stripe microlens layer 32 at the first time. Then, as shown in FIG. 6(d), after transparent photoresist 34 is coated over the substrate, a photoresist pattern 34 for opening the pad portions is formed by selective exposure and development of the photoresist 34, and the top coating layer 31 and the flat layer 27 on the pad portions are etched exposing the pads 23 using the photoresist pattern 34 as a mask. At this time, stripe microlenses 32A each having a flat top are formed by making the top portion of the stripe microlens layer 32 being over etched 36 to a certain thickness by prolonging the etching time period a little longer (about twenty to thirty seconds) in the etching process of the top coating layer 31 and the flat layer 27.

In this case, the stripe microlens 32A part is not shown with a section view but with a perspective view, partially, to show a lens section Y having a flat top.

Figure 6E:
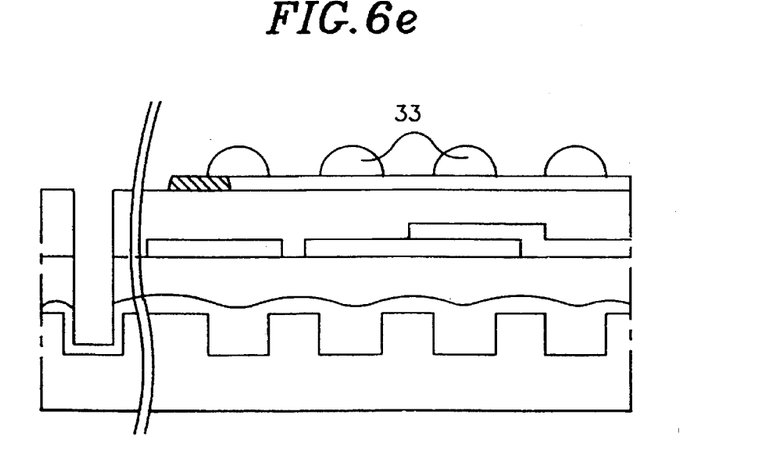

Then, as shown in FIG. 6(e), after the remaining photoresist 34 has been removed, transparent photoresist for forming mosaic microlens layer is coated on the flat top stripe microlens layer 32A, and exposure, development and reflow are carried out to form a mosaic microlens layer 33, finally completing a color solid state image sensing element having a double layered microlens layer.

As seen above, this invention makes forming of mosaic microlenses easy because each of the microlenses is formed on the flat top which is formed in an etching process of the upper part of the stripe microlens. Moreover, because the etching process of the upper part of the stripe microlenses is carried out together with the etching process for exposing the pad portions 23 as described above, it can be carried out easily without requiring an additional process.

In the fabrication of double layered microlenses, following the trend of making slim solid state image sensing elements, the height of a stripe microlens has to be low (about one µm). When the height of a stripe microlens is formed low like that, the curvature of the stripe microlens increases. To carry out the role of a microlens properly focusing light onto a photodiode area the curvatures of the stripe microlens below and the mosaic microlens above have to be the same to a certain extent. To make the curvature of the sides of the stripe microlens connected with the lens surface of the mosaic microlens conform to the curvature of the mosaic microlens formed on top of the stripe microlens having relatively smaller curvature, the stripe microlens also should have a curvature below a certain value; lowering the height of the stripe microlenses is limited, accordingly.

However, in fabrication of stripe microlenses in accordance with this invention, by etching the upper portion of a stripe microlens to a certain thickness after forming a stripe microlens layer by reflowing photoresist to a height enough to obtain a desired curvature, a stripe microlens which is thin, but has a certain degree of curvature capable of matching with the curvature of the mosaic microlens can be easily fabricated. Shown in FIGS. 7(a) and 7(b) are a comparison of a conventional double layered microlens with a double layered microlens in accordance with this invention.

Figure 7A:
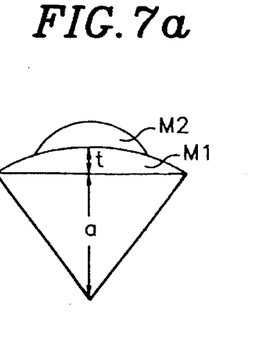
FIGS. 7(a) and 7(b) are a comparison of double layered conventional microlenses and an embodiment in accordance with this invention.
Figure 7B:
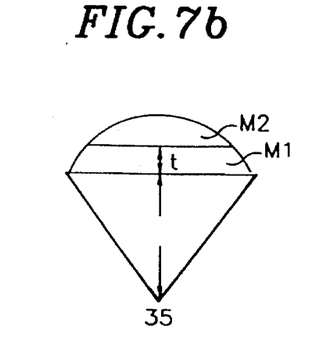

FIG. 7(a) shows a conventional microlens, and FIG. 7(b) shows a microlens in accordance with this invention, wherein when the curvatures of the conventional mosaic microlens M2 and the mosaic microlens in accordance with this invention M1 are the same, and the thicknesses t of the conventional stripe microlens M1 and the stripe microlens in accordance with this invention M1 are the same, and in case when the stripe microlens is formed so that the stripe microlens has a certain degree of curvature capable of matching with the curvature of the mosaic microlens, the curvature of the conventional stripe microlens becomes greater than the curvature of the stripe microlens in accordance with this invention.

Accordingly, it can be known that the focal length b of the microlens in accordance with this invention becomes shorter than the focal length a of the conventional microlens. As such, because decreasing the curvature of a microlens becomes easier, this invention can serve to make solid state image sensing elements slim.

Moreover, in foregoing conventional arts, because the pad portions are opened with an etching process using photoresist after forming all the stripe microlens layer and the mosaic microlens layer, to prevent the microlens layer from etching, the photoresist has to be more thickly coated to a thickness about five to six µm, making establishment of a processing condition in exposing process difficult. However, in accordance with this invention, because pad opening process using photoresist is carried out after the stripe microlens layer has been formed, and over etch of the upper part of the stripe microlens layer is allowed in the pad opening process, even though selective etching ratio with the flat layer is taken into consideration, the thickness of the photoresist required in the pad opening process becomes about 3.5 to 4 µm, which makes the exposing process easy.

As explained in the foregoing description, this invention can serve to improve the sensitivity of solid state image sensing elements and to make solid state image sensing elements slim, because this invention allows microlenses of a solid state image sensing element to be easily fabricated and an easy adjustment of the curvature and the height.

What is claimed is:

1. A solid state image sensing element, comprising:

a substrate;

photodiode areas, each having a plurality of photodiodes in matrix array, formed on said substrate;

a flat area formed over said substrate and including said photodiode areas;

color filter layers formed in predetermined areas on said flat area;

a top coating layer formed over said substrate and including said predetermined areas;

stripe microlenses, each having a flat upper surface and an arc-shaped side surface, arranged corresponding to said photodiodes arranged in one direction in said photodiode areas and formed on said top coating layer; and mosaic microlenses formed on said flat upper surface of said stripe microlenses, each arranged corresponding to each of said photodiodes in said photodiode areas;

wherein each of said mosaic microlenses has an oval shape whose long axis is disposed along a long axis of said stripe microlens.

2. A solid state image sensing element, comprising:

a support member;

a stripe microlens having a flat upper surface and an arc-shaped side surface, formed on said support member;

a plurality of mosaic microlenses formed on said flat upper surface;

wherein when viewed in cross-section in a row direction of said sensing element, both outer edges of said stripe microlens are spaced a distance inwardly from outer top edges of said support member.

3. The solid state image sensing element as claimed in claim 2, wherein when viewed in said cross-section said stripe microlens and said mosaic microlens both define curves and the curves smoothly join together.

4. The solid state image sensing element as claimed in claim 2, wherein when viewed in said cross-section, said stripe microlens and said mosaic microlens define curves having the same degree of curvature.

5. The solid state image sensing element as claimed in claim 2, wherein said stripe microlens is formed in an etch back process.

6. A solid state image sensing element, comprising:

a support member;

a stripe microlens having a flat upper surface and an arc-shaped side surface, formed on said support member; and a plurality of mosaic microlenses formed on said flat upper surface;

wherein when viewed in cross-section in a row direction of said sensing element, outer surfaces of said stripe microlens and said mosaic microlenses together define a continuous smooth curve between them.

7. The solid state image sensing element as claimed in claim 6, wherein said continuous smooth curve comprises an arc.

8. The solid state image sensing element as claimed in claim 6, wherein each said mosaic microlens defines in plan view an oval, the ovals being aligned end-to-end on said flat surface.

* * * * *